United States Patent [19]

Heeger et al.

[11] 4,204,216

[45] May 20, 1980

[54] ELECTRICALLY CONDUCTING DOPED POLYACETYLENE FILM EXHIBITING N-TYPE ELECTRICAL CONDUCTIVITY AND METHOD OF PREPARING SAME

[75] Inventors: Alan J. Heeger, Wynnewood; Alan G. MacDiarmid, Drexel Hill; Chwan K. Chiang, Upper Darby; Shek-Chung Gau, Philadelphia, all of Pa.

[73] Assignee: University Patents, Inc., Norwalk, Conn.

[21] Appl. No.: 902,666

[22] Filed: May 4, 1978

[51] Int. Cl.$^2$ .............................................. H01L 29/28
[52] U.S. Cl. ........................................ 357/8; 357/15; 252/500; 252/512
[58] Field of Search .................... 252/512, 500; 357/8, 357/15

[56] References Cited

PUBLICATIONS

Abstracts of Papers of American Chemical Society 175th ACS Meetings, Mar. 13–17, 1978, Abstract 121.
Bulletin of the American Physical Society, vol. 23, No. 3, Mar. 1978, p. 304.
Berets et al, Trans. Faraday Soc., vol. 64, pp. 823–828 (1968).
Shirakawa et al. J.C.S. Chem. Comm. pp. 578–580 (Sep. 1977).
Ito et al, Journal of Polymer Science, Part A–1, Polymer Chemistry Edition, vol. 13, pp. 1943–1950 (1975).
Chiang et al, Physical Review Letters, vol. 39, No. 17, pp. 1098–1101 (Oct. 1977).
Shirakawa et al, Polymer Journal, vol. 2, No. 2, pp. 231–244 (1971).
Shirakawa et al, Polymer Journal, vol. 4, No. 4, pp. 460–462 (1973).
Ito et al, Journal of Polymer Science, Part A–1, Polymer Chemistry Edition, vol. 12, pp. 11–20 (1974).

*Primary Examiner*—E. Suzanne Parr
*Attorney, Agent, or Firm*—Jerome M. Teplitz; A. Sidney Alpert; David N. Koffsky

[57] ABSTRACT

Electrically conducting organic polymeric film material exhibiting a preselected room temperature n-type electrical conductivity ranging from that characteristic of semiconductor behavior to that characteristic of metallic behavior, is prepared by controlled electron donor doping of a polycrystalline film of polyacetylene with a metal dopant whose Pauling electronegativity value is no greater than 1.6. Preferred metal dopants are the alkali metals. The procedure may be employed in preparing polyacetylene film with a p-n junction formed by two adjacent portions of the film respectively provided wth p-type and n-type electrical conductivities.

27 Claims, No Drawings

ELECTRICALLY CONDUCTING DOPED POLYACETYLENE FILM EXHIBITING N-TYPE ELECTRICAL CONDUCTIVITY AND METHOD OF PREPARING SAME

BACKGROUND OF THE INVENTION

The Government has rights in this invention pursuant to Contract No. N00014-75-C-0962 awarded by the Office of Naval Research.

This invention relates to electrically conducting organic polymeric material and, more particularly, to the selective modification of the room temperature electrical conductivity of polyacetylene by controlled chemical doping thereof.

For use in a wide variety of electronic device applications, it is highly desirable to have available electrically conducting materials having a preselected room temperature electrical conductivity varying over a broad range extending from slightly conducting to highly conducting. Furthermore, particularly for use in semiconductor device applications, requiring one or more p-n junctions, such materials should advantageously be available with both p-type and n-type electrical conductivities.

A number of semiconducting organic materials are known whose room temperature electrical conductivities may be varied over several orders of magnitude in the lower region of such range by appropriate chemical doping with electron acceptor and/or electron donor dopants. However, such doping techniques have not generally proven to be successful in achieving increases in room temperature electrical conductivity to the degree necessary for rendering these materials highly conductive to the point of exhibiting or approaching metallic behavior, nor in effecting conversion from one to the other of p-type and n-type conductivities.

One of the materials whose electrical conductivity properties have previously been modified by chemical doping, is the p-type semiconducting organic polymer, polyacetylene, $(CH)_x$, prepared in the form of a powder. Studies on the effects of chemical doping with electron acceptors and donors on the room temperature electrical conductivity of polyacetylene powder compressed into a pellet, have been reported by Berets et al, Trans. Faraday Soc., Volume 64, pages 823-828 (1968). These studies showed that the initial room temperature p-type electrical conductivity of the polymer (on the order of about $10^{-6}$ ohm$^{-1}$ cm$^{-1}$) could be increased by a factor as high as $10^3$ by electron acceptor doping, and decreased by a factor as high as $10^4$ by electron donor doping. Thus, while Berets et al indicate the possibility of varying the room temperature p-type electrical conductivity of polyacetylene powder over a range of approximately seven orders of magnitude, the highest room temperature electrical conductivity which they are able to achieve is still relatively low, on the order of only $10^{-3}$ ohm$^{-1}$ cm$^{-1}$. Moreover, there is no indication given by Berets et al that the p-type electrical conductivity of polyacetylene could be converted by such chemical doping into an n-type electrical conductivity.

Recently, polyacetylene has been successfully synthesized in the form of high quality uniformly thin flexible silvery-copper-colored polycrystalline films of cis-polyacetylene and silvery polycrystalline films of transpolyacetylene, by polymerizing acetylene monomer in the presence of a Ti-$(OC_4H_9)_4$-Al$(C_2H_5)_3$ catalyst system, employing a critical catalyst concentration to avoid the formation of polyacetylene powder, and critical polymerization temperatures (temperatures lower than $-78°$ C. for obtaining the cis polymer, and temperatures higher than 150° C. for obtaining the trans polymer). Polymerization temperatures between $-78°$ C. and 150° C. result in the polymer having a mixed cis-trans structure. The details of the synthesis of these polycrystalline films of polyacetylene and their characterization are described in a series of papers by Shirakawa et al (Polymer Journal, Volume 2, No. 2, pages 231-244, 1971; Polymer Journal, Volume 4, No. 4, pages 460-462, 1973; Journal of Polymer Science, Part A-1, Polymer Chemistry Edition, Volume 12, pages 11-20, 1974; and Journal of Polymer Science, Part A-1, Polymer Chemistry Edition, Volume 13, pages 1943-1950, 1975), all of which are incorporated herein by reference.

The polycrystalline films of trans-polyacetylene and cis-polyacetylene described by Shirakawa et al, are both p-type semiconducting materials, but varying in room temperature electrical conductivity. The room temperature electrical conductivity of the trans-polyacetylene is typically about $4.4 \times 10^{-5}$ ohm$^{-1}$ cm$^{-1}$, while that of the cis-polyacetylene is typically about $1.7 \times 10^{-9}$ ohm$^{-1}$ cm$^{-1}$, depending on the method of preparation.

It has also recently been found that by controlled chemical doping of polyacetylene in the form of a polycrystalline film, such as those described by Shirakawa et al, with a conductivity-increasing amount of an electron acceptor dopant and/or a conductivity-decreasing amount of an electron donor dopant, it is possible to produce a whole family of p-type electrically conducting doped polyacetylene films whose room temperature electrical conductivity may be preselected over the entire range characteristic of semiconductor behavior and into the range characteristic of metallic behavior. Such doping procedure is described and claimed in the commonly assigned, copending U.S. patent application Ser. No. 902,667, of Alan J. Heeger, Alan G. MacDiarmid, Chwan K. Chiang and Hideki Shirakawa, filed on even date herewith entitled "P-TYPE ELECTRICALLY CONDUCTING DOPED POLYACETYLENE FILM AND METHOD OF PREPARING SAME", and incorporated herein by reference. As disclosed in said copending Heeger et al application, high levels of room temperature p-type electrical conductivity characteristic of or approaching metallic behavior, i.e., on the order of about $10^{-1}$ to about $10^3$ ohm$^{-1}$ cm$^{-1}$, can be achieved with a number of electron acceptor dopants, including bromine, iodine, iodine chloride, iodine bromide and arsenic pentafluoride, at dopant levels ranging from less than 0.001 to about 0.3 mol of dopant per —CH— unit of the polyacetylene, with lower doping levels resulting in proportionally lower conductivity increases. Electron donor doping of the polyacetylene film with, for example, trace amounts of ammonia or methylamine, is disclosed in said copending Heeger et al application only for the purpose of effecting either a decrease in the initial room temperature p-type electrical conductivity of the starting polyacetylene film or some degree of compensation of the increased room temperature p-type electrical conductivity of the electron acceptor-doped polyacetylene film, with no mention being made of the possibility of converting the room temperature electrical conductivity of the polyacetylene film from p-type to n-type.

SUMMARY OF THE INVENTION

It is, accordingly, a primary object of the present invention to provide an n-type electrically conducting organic polymeric material exhibiting a high room temperature electrical conductivity characteristic of or approaching metallic behavior.

Another object of the invention is to provide an n-type electrically conducting organic polymeric material whose room temperature electrical conductivity may be preselected within a broad range of selectivity varying from that characteristic of semiconductor behavior to that characteristic of metallic behavior.

A further object of the invention is to provide an electrically conducting doped polyacetylene film, at least a portion of which exhibits a room temperature n-type electrical conductivity which may be preselected within a broad range of selectivity varying from that characteristic of semiconductor behavior to that characteristic of metallic behavior.

Still another object of the invention is to provide an electrically conducting doped polyacetylene film in accordance with the preceding object, which includes one or more p-n junctions formed by two adjacent portions of the film exhibiting, respectfully, p-type and n-type electrical conductivities.

A still further object of the invention is to provide a method of modifying the electrical conductivity properties of a p-type semiconducting polycrystalline film of polyacetylene so as to provide at least a portion thereof with a preselected room temperature n-type electrical conductivity ranging from that characteristic of semiconductor behavior to that characteristic of metallic behavior.

Yet another object of the invention is to provide a method in accordance with the preceding object, which results in the production of a p-n junction formed by two adjacent portions of the film being respectfully provided with p-type and n-type electrical conductivities.

The above and other objects are achieved in accordance with the present invention by the controlled electron donor doping of at least a portion of a polycrystalline film of polyacetylene with a metal dopant whose Pauling electronegativity value is no greater than 1.6, preferably an alkali metal. It has unexpectedly been found that with such metal dopants, electron donor doping of the polyacetylene film, rather than merely decreasing its room temperature p-type electrical conductivity, results in a conversion of such room temperature electrical conductivity from p-type to n-type. Furthermore, depending upon the degree of doping, the resulting room temperature n-type electrical conductivity may range from that characteristic of semiconductor behavior to that characteristic of metallic behavior. For example, alkali metal-doped polyacetylene films containing from about 0.01 to about 0.30 mol of alkali metal dopant per —CH— unit of the polyacetylene exhibit room temperature n-type electrical conductivities ranging within the orders of from about $10^{-2}$ to about $10^2$ ohm$^{-1}$ cm$^{-1}$, with lower doping levels resulting in proportionally lower conductivities ranging down to the order of about $10^{-7}$ ohm$^{-1}$ cm$^{-1}$.

The doping procedure may be carried out in accordance with the present invention by contacting at least a portion of the polyacetylene film with a doping solution comprising an organic radical anion compound of the metal dopant dissolved in an inert organic solvent. The polyacetylene so contacted becomes electron donor-doped with the metal dopant to a degree proportional with the metal compound concentration in the doping solution and the contacting period, which are controlled so that the corresponding degree of doping will be such as to provide the resulting electron donor-doped polyacetylene with a preselected room temperature n-type electrical conductivity. The film is thereafter washed with an additional amount of the inert organic solvent to remove any residual doping solution therefrom. Alternatively, the metal compound-containing doping solution may be replaced by a liquid alloy of sodium and potassium or by a solution of sodium in liquid ammonia.

The electron donor doping method of the present invention thus enables the production of a whole family of n-type electrically conducting doped polyacetylene films whose room temperature electrical conductivity may be preselected within a broad range of selectivity varying from that characteristic of semiconductor behavior to that characteristic of metallic behavior, so as to be suitable for use in a wide variety of electronic device applications. Furthermore, and particularly in combination with the electron acceptor doping techniques described and claimed in the copending Heeger et al application referred to above, the present invention enables the production of electrically conducting doped polyacetylene film provided with one or more p-n junctions formed by two adjacent portions of the film being respectively provided with p-type and n-type electrical conductivities, so as to be suitable for use in various semiconductor device applications requiring such p-n junctions.

DESCRIPTION OF PREFERRED EMBODIMENTS

In carrying out the electron donor doping method in accordance with the present invention, the polyacetylene starting material is in the form of a polycrystalline film which may be prepared, for example, by the methods described in the Shirakawa et al papers referred to above and incorporated herein by reference. Depending on the polymerization temperature employed in preparing such films, the polyacetylene may have an all cis structure (polymerization temperatures lower than −78° C.), an all trans structure (polymerization temperatures higher than 150° C.), or a mixed cis-trans structure (polymerization temperatures between −78° C. and 150° C.). While any of these polycrystalline polyacetylene films may suitably be employed in carrying out the doping method in accordance with the present invention, best results are generally obtained when the doped material is prepared from a cis-polyacetylene starting film.

The electron donor dopant employed in accordance with the present invention is a metal whose Pauling electronegativity value is no greater than 1.6. A complete list of such metals and their corresponding electronegativity values are provided in Table I below.

TABLE I

| Metal | Electronegativity Value |
|---|---|
| Cs | 0.7 |
| Rb | 0.8 |
| K | 0.8 |
| Na | 0.9 |
| Ba | 0.9 |
| Li | 1.0 |
| Sr | 1.0 |

TABLE I-continued

| Metal | Electronegativity Value |
|---|---|
| Ca | 1.0 |
| Mg | 1.2 |
| Y | 1.3 |
| Sc | 1.3 |
| Be | 1.5 |
| Al | 1.5 |
| Zr | 1.6 |
| Ti | 1.6 |

The above list of metals includes all of the alkali metals, all of the alkaline earth metals, and certain of the metals from Group 3 (Y, Sc and Al) and Group 4 (Zr and Ti) of the Periodic Table. The preferred metal dopants for use in the present invention are the alkali metals, particularly sodium, potassium and lithium.

Conversion of the starting polyacetylene film from a p-type to an n-type material may suitably be effected with any one of the metal dopants listed above. The resulting room temperature n-type electrical conductivity of the metal-doped polyacetylene will vary with the particular metal dopant employed and degree of doping. With any given metal dopant, the resulting n-type conductivity will increase with increasing degrees of doping up to a certain point at which the maximum n-type conductivity is obtained for that dopant. Such maximum conductivity will generally be obtained at a degree of doping not greater than about 0.30 mol of metal dopant per —CH— unit of the polyacetylene. For example, with the preferred alkali metal dopants, a degree of doping within the range of from about 0.01 to about 0.30 mol of alkali metal dopant per —CH— unit of the polyacetylene will provide the resulting doped polyacetylene with a room temperature n-type electrical conductivity ranging within the orders of from about $10^{-2}$ to about $10^2$ ohm$^{-1}$ cm$^{-1}$, with lower degrees of doping resulting in proportionally lower n-type conductivities down to a minimum on the order of approximately $10^{-7}$ ohm$^{-1}$ cm$^{-1}$. Since the semiconductor-metal transition of the doped polyacetylene will generally be reached at a conductivity of approximately 1 ohm$^{-1}$ cm$^{-1}$, this provides a broad range of selectivity in the resulting room temperature n-type electrical conductivity of the doped polyacetylene, extending about 9 orders of magnitude over most of the semiconductor regime and into the metallic regime.

One of the doping procedures in accordance with the present invention employs a doping solution comprising an organic radical anion compound of the metal dopant dissolved in a suitable inert organic solvent. The organic radical moiety of the compound may be any suitable organic radical anion, derived from, for example, naphthalene, bipyridyl, biphenyl, phenanthrene, or the like. The inert organic solvent may suitably be any organic solvent in which the metal compound is soluble and which is inert with respect to the polyacetylene, such as, for example, tetrahydrofuran, monoglyme, diglyme, or the like. The preferred doping solution for carrying out the method of the present invention are solutions of an alkali metal naphthalide in tetrahydrofuran wherein the concentration of alkali metal naphthalide is within the range of from about 0.001 to about 2.0 molar. The solutions of lower molarity are preferably employed when the doped polyaceytlene film being prepared is to have a relatively low room temperature n-type electrical conductivity, while the solutions of higher molarity are preferably employed when such doped film is to have a relatively high conductivity.

For producing a metal-doped polyacetylene film exhibiting a preselected room temperature n-type electrical conductivity employing the above-described doping solutions, a metal dopant is selected whose maximum conductivity-modifying capability is at least sufficiently great to achieve such preselected value. The film is contacted with the doping solution, whereby uptake of the dopant metal cations into the polyacetylene chain occurs by electron transfer from the organic radical anions to a degree proportional with both the metal compound concentration in the doping solution and the contacting period. Such concentration and contacting period are coordinated and controlled so that the corresponding degree of doping will be such as to provide the resulting doped polyacetylene film with the preselected room temperature n-type electrical conductivity. Generally, the proper combination of metal compound concentration and contacting period to obtain the desired degree of doping can be predetermined by trial and error procedures. For example, with the preferred doping solutions in accordance with the present invention, i.e., a 0.001 to 2.0 molar solution of an alkali metal naphthalide in tetrahydrofuran, the starting polyacetylene film may be contacted with the doping solution for a contacting period ranging from a new minutes to about four hours to provide a degree of doping within the range of from about 0.01 to about 0.30 mol of alkali metal dopant per —CH— unit of the polyacetylene, and thereby provide the doped polyacetylene film with a preselected room temperature n-type electrical conductivity ranging within the orders of from about $10^{-2}$ to about $10^2$ ohm$^{-1}$ cm$^{-1}$.

At the completion of the doping period, the doped film is removed from the doping solution and thereafter washed in an additional amount of the inert organic solvent to remove any residual doping solution therefrom, and the excess solvent is then pumped off in a high vacuum.

In alternative doping procedures in accordance with the present invention, the above-described metal compound-containing doping solutions may be replaced either by a liquid alloy of sodium and potassium or by a solution of sodium in liquid ammonia. In the latter case, the doping procedure would be carried out at a temperature at which the liquid ammonia solution is stable, e.g., at about −78° C. In other respects, these alternative procedures would be similar to that described above.

The electron donor doping method of the present invention, particularly in combination with the electron acceptor doping techniques described and claimed in the copending Heeger et al application referred to above and incorporated herein by reference, finds particularly significant utility in the preparation of electrically conducting doped polyacetylene film including one or more p-n junctions for use in various semiconductor device applications. Such p-n junctions are formed by two adjacent portions of the film being respectively provided with p-type and n-type electrical conductivities which, for most applications, should both be in the semiconducting regime (i.e., less than about 1 ohm$^{-1}$ cm$^{-1}$), and matched as closely as possible in their magnitudes. The ability to selectively modify the room temperature electrical conductivity properties of a starting polyacetylene film both within the n-type semiconducting regime, as provided by the electron donor doping method of the present invention, as well as within the p-type semiconducting regime, as provided by the electron acceptor doping techniques described in said copending Heeger et al application, renders polyacetylene film a highly versatile starting material for use in the production of a whole family of p-n junctions whose room temperature electrical conductivity properties may be preselected within a broad range of selectivity extending over most of the semiconducting regime.

Several different techniques may be employed for producing the p-n junctions. The simplest technique is merely to unite together, for example, by mechanical pressing under sufficient pressure so as to form a unitary film material, two separate polyacetylene film strips, one of which has been electron donor-doped in accordance with the method of the present invention to exhibit n-type electrical conductivity, and the other of which exhibits p-type electrical conductivity, preferably increased from its initial value by the electron acceptor doping method described in said copending Heeger et al application. It is also possible to form the p-n junction directly on a single polyacetylene film strip, which may be accomplished by following several alternative procedures.

One such procedure is to carry out the electron donor doping method of the present invention on only the first of two adjacent portions of a single polyacetylene film strip, for example, by suitable masking of the second adjacent portion. This will result in the first adjacent portion exhibiting n-type electrical conductivity, and the second adjacent portion exhibiting p-type electrical conductivity, thereby forming the p-n junction. If necessary, the room temperature p-type electrical conductivity of the second adjacent portion may be increased to the desired level by the electron acceptor doping techniques described in said copending Heeger et al application, accompanied by suitable masking of the first adjacent portion, either prior to or subsequent to the electron donor doping of the first adjacent portion.

An alternative procedure for forming the p-n junction is based upon the finding that the electron donor doping method of the present invention and the electron acceptor doping method described in said copending Heeger et al application, have compensating effects on each other. In other words, when a starting polyacetylene film which has previously been electron acceptor-doped to increase its p-type electrical conductivity, is subjected to the electron donor doping method of the present invention, the film, as the doping proceeds, first of all undergoes a reduction in its p-type conductivity, then a conversion to an n-type material, and thereafter an increase in its n-type conductivity. Similarly, when a starting polyacetylene film which has previously been electron donor-doped in accordance with the present invention to an n-type material, is subjected to electron acceptor doping, the film, as the doping proceeds, undergoes first a reduction in its n-type conductivity, then a reconversion to a p-type material, and thereafter an increase in its p-type conductivity. Such compensation effects make it possible to form a p-n junction starting with a polyacetylene film which has been either entirely electron acceptor-doped to an increased p-type conductivity or entirely electron donor-doped to an n-type material. In the first case, a portion of the electron acceptor-doped polyacetylene film is suitably masked, and its adjacent portion is compensated with a sufficient amount of an electron donor dopant in accordance with the present invention so as to convert its electrical conductivity from p-type to n-type, thereby forming the p-n junction. In the second case, a portion of the electron donor-doped polyacetylene film is suitably masked, and its adjacent portion thereafter compensated with a sufficient amount of an electron acceptor dopant so as to reconvert its electrical conductivity from n-type to p-type, thereby forming the p-n junction.

The invention is further illustrated by way of the following examples, wherein the polyacetylene starting materials were in the form of polycrystalline films varying in thickness from 0.1 micron to 1.0 mm, prepared by the methods described in the Shirakawa et al papers referred to above, and composed either of cis-polyacetylene, transpolyacetylene, or polyacetylene having a mixed cis-trans structure.

EXAMPLE 1

Several doping solutions were prepared consisting of varying molarities of either sodium naphthalide, potassium naphthalide or lithium naphthalide dissolved in tetrahydrofuran. Samples of polycrystalline polyacetylene film were placed in these doping solutions for various contacting periods. At the end of the contacting period, the films were removed from the doping solution and rinsed with tetrahydrofuran to remove any residual doping solution therefrom. The excess solvent was then pumped off in a high vacuum.

The room temperature electrical conductivities of the doped films were measured using four-probe dc techniques. The final compositions of the doped films were determined by elemental analysis and/or by the increase in weight of the film during doping.

The resulting compositions of the doped films, the molarity of the alkali metal naphthalide doping solution and contacting period employed in their preparation, and their corresponding room temperature n-type electrical conductivities are set forth in Table II below. The prefix "cis" or "trans" in the Table refers to the predominant isomeric form of the polyacetylene in the starting film employed in the doping procedure.

TABLE II

| Doped Polyacetylene Film Composition | Molarity of Doping Solution | Contacting Period (hr) | Conductivity (25° C. (ohm $-1$ cm$^{-1}$) |
|---|---|---|---|
| trans-[Na$_{0.28}$(CH)]$_x$ | ~1 | 0.5 | 80 |
| cis-[Na$_{0.27}$(CH)]$_x$ | ~1.3 | 0.5 | 100 |
| cis-[Na$_{0.21}$(CH)]$_x$ | 1 | 0.5 | 25 |
| cis-[K$_{0.013}$(CH)]$_x$ | 0.001 | 0.5 | $2 \times 10^{-2}$ |
| cis-[K$_{0.16}$(CH)]$_x$ | 1 | 0.5 | 50 |
| cis-[K$_{0.17}$(CH)]$_x$ | 1 | 16 | 40 |
| cis-[Li$_{0.3}$(CH)]$_x$ | ~1.5 | 0.5 | 200 |

Transport studies and far-infrared transmission measurements carried out on the above doped polyacetylene film samples indicate that those samples exhibiting room temperature conductivities greater than about 1 ohm$^{-1}$ cm$^{-1}$ have undergone the semiconductor-metal transition and exhibit conductivity properties characteristic of metallic behavior. As shown by the data in Table II, by varying the molarity of the doping solution and/or the contacting period so as to vary the degree of doping, the method of the present invention enables the production of a whole series of electrically conducting doped polyacetylene films whose room temperature n-type electrical conductivity can be preselected and varied over a range from that characteristic of semiconductor behavior to that characteristic of metallic behavior.

EXAMPLE 2

An n-type electrically conducting doped polyacetylene film was prepared by placing a starting polycrystalline film of cis-polyacetylene in a one molar sodium naphthalide solution in tetrahydrofuran for one half hour, then removing the film from the doping solution and rinsing it with tetrahydrofuran to remove any residual doping solution therefrom, and thereafter pumping off the excess solvent in a high vacuum. By determining the increase in weight of the film during doping, the doped film was found to contain about 0.2 mol of sodium per —CH— unit of the polyacetylene.

A p-type electrically conducting doped polyacetylene film was prepared by exposing a starting polycrystalline film of cis-polyacetylene in an evacuated reaction vessel to arsenic pentafluoride vapor while continuously monitoring the electrical conductivity of the film by means of electrodes attached to the film. After the conductivity of the film had exceeded $10^{-2}$ ohm$^{-1}$ cm$^{-1}$, the arsenic pentafluoride vapor was pumped out of the vessel. By determining the increase in weight of the film during doping, the film was found to contain about 0.1 mol of arsenic pentafluoride per —CH— unit of the polyacetylene.

A simple rectifying p-n junction was formed by mechanically pressing together the above-prepared n-type and p-type doped polyacetylene films under sufficient pressure so as to unite them into a unitary film material. The I-V curve of the resulting p-n junction evidenced a typical diode characteristic. The forward and reverse bias directions of the junction, as well as the thermoelectric power data, were in agreement with the above-described n-type and p-type assignments.

EXAMPLE 3

An n-type electrically conducting sodium-doped polyacetylene film containing about 0.2 mol of sodium per —CH— unit of the polyacetylene, was prepared as described above in Example 2. Half of the film was masked by coating it with a protective layer of grease. The film was then placed in an evacuated reaction vessel and exposed to iodine vapor for a contacting period of approximately ten hours while continuously monitoring the electrical conductivity of the unprotected half of the film by means of electrodes attached thereto. Such electrical conductivity was found to degrease by over four orders of magnitude to a minimum value during the first four hours of the contacting period, and thereafter to increase by almost two orders of magnitude from such minimum value during the remainder of the contacting period. At the end of the contacting period, the film was taken out of the vessel, and the protective layer of grease removed therefrom.

The above procedure resulted in the unmasked portion of the film being converted to a p-type material and thereby forming a p-n junction with the n-type half of the film which had been masked during the iodine doping. The forward and reverse bias directions of the p-n junction, as well as the thermoelectric power data, were in agreement with these n-type and p-type assignments.

EXAMPLE 4

A starting polycrystalline film of cis-polyacetylene was placed in contact with a liquid alloy of sodium and potassium and left overnight at room temperature. At the end of the contacting period, the room temperature n-type electrical conductivity of the resulting doped polyacetylene film was found to be 16 ohm$^{-1}$ cm$^{-1}$.

EXAMPLE 5

A starting polycrystalline film of cis-polyacetylene was placed in a solution of sodium in liquid ammonia at a temperature of $-78°$ C. for a contacting period of 30 minutes. At the end of the contacting period, the film was washed with liquid ammonia until the liquid ammonia was colorless. The excess liquid ammonia was then pumped off in a high vacuum. The room temperature n-type electrical conductivity of the resulting sodium-doped polyacetylene film was found to be 20 ohm$^{-1}$ cm$^{-1}$.

The electrically conducting doped polyacetylene films produced in accordance with the present invention are useful in a wide variety of semiconductor device applications. For example, the films which are entirely electron donor-doped to an n-type material have been used in conjunction with a metallic conductor such as platinum, for producing Schottky barrier diodes. Such Schottky barrier diodes, as well as the films which are formed with a p-n junction, may be used in the production of photodiodes, either of the photoconductive or photovoltaic type, with particularly significant potential utility as photovoltaic solar cells.

The embodiments of the invention in which an exclusive property or privilege is claimed are defined as follows:

1. An electrically conducting polycrystalline film of polyacetylene, at least a portion of which is electron donor-doped to a controlled degree with a metal dopant whose Pauling electronegativity value is no greater than 1.6, said controlled degree of doping being such as to provide the electron donor-doped polyacetylene with a preselected room temperature n-type electrical conductivity ranging from that characteristic of semiconductor behavior to that characteristic of metallic behavior.

2. The polycrystalline film of claim 1, wherein said metal dopant is an alkali metal.

3. The polycrystalline film of claim 2, wherein said electron donor-doped polyacetylene contains from about 0.01 to about 0.30 mol of alkali metal dopant per —CH— unit of the polyacetylene and exhibits a room temperature n-type electrical conductivity ranging within the orders of from about $10^{-2}$ to about $10^2$ ohm$^{-1}$ cm$^{-1}$.

4. The polycrystalline film of claim 2, wherein the polyacetylene is cis-polyacetylene.

5. The polycrystalline film of claim 2, wherein the polyacetylene is trans-polyacetylene.

6. The polycrystalline film of claim 2, wherein the polyacetylene has a mixed cis-trans structure.

7. The semiconductor device of claim 1, wherein said p-n junction is formed by two adjacent portions of said polycrystalline film, one of said adjacent portions being composed of said electron donor-doped polyacetylene exhibiting n-type electrical conductivity, and the other of said adjacent portions being composed of polyacetylene exhibiting p-type electrical conductivity.

8. The semiconductor device of claim 7, wherein said polyacetylene exhibiting p-type electrical conductivity is electron acceptor-doped polyacetylene.

9. The semiconductor device of claim 8, wherein said polyacetylene exhibiting n-type electrical conductivity is electron acceptor-doped polyacetylene which has been compensated with a sufficient amount of said metal dopant so as to convert its electrical conductivity from p-type to n-type.

10. The semiconductor device of claim 7, wherein said polyacetylene exhibiting p-type electrical conductivity is said electron donor-doped polyacetylene which has been compensated with a sufficient amount of an electron acceptor dopant so as to reconvert its electrical conductivity from n-type to p-type.

11. A method of modifying the electrical conductivity properties of a polycrystalline film of polyacetylene so as to provide at least a portion thereof with a preselected room temperature n-type electrical conductivity ranging from that characteristic of semiconductor behavior to that characteristic of metallic behavior, comprising the steps of:
(a) contacting at least a portion of said film with a doping solution comprising an organic radical anion compound of a metal whose Pauling electronegativity value is no greater than 1.6 dissolved in an inert organic solvent, whereby the polyacetylene so contacted becomes electron donor-doped with said metal to a degree proportional with the metal compound concentration in said doping solution and the contacting period;
(b) controlling said metal compound concentration and said contacting period so that the corresponding degree of doping will be such as to provide the resulting electron donor-doped polyacetylene with said pre-selected room temperature n-type electrical conductivity; and
(c) thereafter washing said film with an additional amount of said inert organic solvent to remove any residual doping solution therefrom.

12. The method of claim 11, wherein the polyacetylene starting material is cis-polyacetylene.

13. The method of claim 11, wherein the polyacetylene starting material is trans-polyacetylene.

14. The method of claim 11, wherein the polyacetylene starting material is polyacetylene having a mixed cis-trans structure.

15. The method of claim 11, wherein said metal compound in said doping solution is an alkali metal naphthalide.

16. The method of claim 15, wherein the concentration of alkali metal naphthalide in said doping solution is within the range of from about 0.001 to about 2.0 molar.

17. The method of claim 16, wherein said preselected room temperature n-type electrical conductivity ranges within the orders of from about $10^{-2}$ to about $10^2$ ohm$^{-1}$ cm$^{-1}$, said degree of doping is within the range of from about 0.01 to about 0.30 mol of alkali metal dopant per —CH— unit of the polyacetylene, and said contacting period is within the range of from a few minutes to about 4 hours.

18. The method of claim 11, wherein only the first of two adjacent portions of said film is electron donor-doped to said n-type electrical conductivity, and a p-n junction is formed by said two adjacent portions.

19. The method of claim 18, wherein the second of said two adjacent portions of said film is electron acceptor-doped to increase its p-type electrical conductivity either prior or subsequent to the electron donor doping of said first adjacent portion.

20. The method of claim 18, wherein the entire starting polyacetylene film is electron acceptor-doped to increase its p-type electrical conductivity prior to the electron donor doping of said first adjacent portion.

21. The method of claim 11, wherein the entire film is first electron donor-doped to said n-type electrical conductivity, and a portion thereof is thereafter compensated with a sufficient amount of an electron acceptor dopant so as to reconvert its electrical conductivity from n-type to p-type, thereby providing said film with a p-n junction.

22. A method of modifying the electrical conductivity properties of a polycrystalline film of polyacetylene so as to provide at least a portion thereof with a preselected room temperature n-type electrical conductivity ranging from that characteristic of semiconductor behavior to that characteristic of metallic behavior, comprising the steps of:
(a) contacting at least a portion of said film with a liquid alloy of sodium and potassium, whereby the polyacetylene so contacted becomes electron donor-doped with said alloy to a degree proportional with the contacting period; and
(b) controlling said contacting period so that the corresponding degree of doping will be such as to provide the resulting electron donor-doped polyacetylene with said preselected room temperature n-type electrical conductivity.

23. A method of modifying the electrical conductivity properties of a polycrystalline film of polyacetylene so as to provide at least a portion thereof with a preselected room temperature n-type electrical conductivity ranging from that characteristic of semiconductor behavior to that characteristic of metallic behavior, comprising the steps of:
(a) contacting at least a portion of said film with a solution of sodium in liquid ammonia at a temperature at which said solution is stable, whereby the polyacetylene so contacted becomes electron donor-doped with the sodium to a degree proportional with the sodium concentration in said solution and the contacting period;
(b) controlling said sodium concentration and said contacting period so that the corresponding degree of doping will be such as to provide the resulting electron donor-doped polyacetylene with said preselected room temperature n-type electrical conductivity; and
(c) thereafter washing said film with an additional amount of liquid ammonia to remove any residual solution therefrom.

24. A semiconductor device including at least one p-n junction formed at least in part by electrically conducting film means comprising the polycrystalline film of claim 1.

25. A semiconductor device including at least one Schottky barrier diode formed by the polycrystalline film of claim 1 in conjunction with a metallic conductor.

26. The semiconductor device of claim 24, wherein said polycrystalline film consists essentially of said electron donor-doped polyacetylene exhibiting n-type electrical conductivity, and said p-n junction is formed by said polycrystalline film in juxtaposition to a second electrically conducting polycrystalline film of polyacetylene exhibiting p-type electrical conductivity.

27. The semiconductor device of claim 26, wherein said polyacetylene exhibiting p-type electrical conductivity is electron acceptor-doped polyacetylene.

* * * * *

UNITED STATES PATENT AND TRADEMARK OFFICE
CERTIFICATE OF CORRECTION

PATENT NO. : 4,204,216
DATED : May 20, 1980
INVENTOR(S) : Alan J. Heeger, et al.

It is certified that error appears in the above-identified patent and that said Letters Patent are hereby corrected as shown below:

Column 5, line 60, "solution" should read --solutions--.

Column 6, line 27, "new" should read --few--.

Column 9, line 25, --doped-- should be inserted before "film", second occurrence.

Column 9, line 49, "degrease" should read --decrease--.

Claim 7, line 1 (Column 10, line 56), the claim reference numeral "1" should read --24--.

Signed and Sealed this

Second Day of September 1980

[SEAL]

Attest:

SIDNEY A. DIAMOND

Attesting Officer

Commissioner of Patents and Trademarks